(12) United States Patent
Chen et al.

(10) Patent No.: US 12,471,304 B2
(45) Date of Patent: Nov. 11, 2025

(54) HIGH ELECTRON MOBILITY TRANSISTOR (HEMT) DEVICE FOR INCREASING THE SCHOTTKY DIODE CURRENT AND METHOD OF FORMING THE SAME

(71) Applicant: United Microelectronics Corp., Hsinchu (TW)

(72) Inventors: Wei Jen Chen, Tainan (TW); Kai Lin Lee, Kinmen County (TW)

(73) Assignee: United Microelectronics Corp., Hsinchu (TW)

( * ) Notice: Subject to any disclaimer, the term of this patent is extended or adjusted under 35 U.S.C. 154(b) by 546 days.

(21) Appl. No.: 17/888,523

(22) Filed: Aug. 16, 2022

(65) Prior Publication Data

US 2024/0014307 A1   Jan. 11, 2024

(30) Foreign Application Priority Data

Jul. 6, 2022  (TW) .................................. 111125329

(51) Int. Cl.
*H10D 30/47* (2025.01)
*H10D 30/01* (2025.01)
*H10D 64/01* (2025.01)
*H10D 64/27* (2025.01)

(52) U.S. Cl.
CPC ......... *H10D 30/475* (2025.01); *H10D 30/015* (2025.01); *H10D 64/01* (2025.01); *H10D 64/411* (2025.01)

(58) Field of Classification Search
CPC ........................... H10D 30/475; H10D 30/015
USPC .......................................................... 257/194
See application file for complete search history.

(56) References Cited

U.S. PATENT DOCUMENTS

| | | | |
|---|---|---|---|
| 8,569,769 B2 | 10/2013 | Hwang et al. | |
| 2008/0087915 A1* | 4/2008 | Uemoto | H10D 62/343 |
| | | | 257/E29.252 |
| 2013/0099285 A1* | 4/2013 | Hwang | H10D 62/8325 |
| | | | 257/E29.246 |

* cited by examiner

*Primary Examiner* — Quoc D Hoang
(74) *Attorney, Agent, or Firm* — JCIPRNET (57) ABSTRACT

A high electron mobility transistor (HEMT) device and a method of forming the HEMT device are provided. The HEMT device includes a substrate, a channel layer, a barrier layer, and a gate structure. The substrate has at least one active region. The channel layer is disposed on the at least one active region. The barrier layer is disposed on the channel layer. The gate structure is disposed on the barrier layer. The gate structure includes a metal layer and a P-type group III-V semiconductor layer vertically disposed between the metal layer and the barrier layer. The P-type group III-V semiconductor layer includes a lower portion and an upper portion on the lower portion, and the upper portion has a top area greater than a top area of the lower portion.

10 Claims, 8 Drawing Sheets

HIGH ELECTRON MOBILITY TRANSISTOR (HEMT) DEVICE FOR INCREASING THE SCHOTTKY DIODE CURRENT AND METHOD OF FORMING THE SAME

REFERENCE TO RELATED APPLICATION

This application claims the priority benefit of Taiwan application serial no. 111125329, filed on Jul. 6, 2022. The entirety of the above-mentioned patent application is hereby incorporated by reference herein and made a part of this specification.

BACKGROUND OF THE INVENTION

Field of the Invention

The disclosure relates to a semiconductor device and a method of forming the integrated circuit, and in particular, to a high electron mobility transistor (HEMT) device and a method of forming the same.

Description of Related Art

In semiconductor technology, group III-V compound semiconductor materials can be used to form various integrated circuit devices, such as: high power field effect transistor, high frequency transistor or high electron mobility transistor (HEMT). The HEMT is a field effect transistor with a two-dimensional electron gas (2DEG) layer where the 2DEG layer is adjacent to the junction between two materials with different energy gaps (i.e., a heterojunction). Since the HEMT does not use the doped region as the carrier channel of the transistor, but uses the 2DEG layer as the carrier channel of the transistor, compared with the conventional MOSFET, the HEMT has various attractive characteristics, such as large energy gap, high carrier mobility, and high-frequency signal transmission capability. However, the conventional HEMT still needs to improve some issues such as the leakage current, the gate control capability, or the like.

SUMMARY OF THE INVENTION

The present invention provides a high electron mobility transistor (HEMT) device, which increases the Schottky diode current by enlarging the contact area between the metal layer and the P-type group III-V semiconductor layer, thereby improving the 2DEG and the gate control capability of the HEMT device.

The present invention provides a HEMT device including: a substrate, a channel layer, a barrier layer, and a gate structure. The substrate has at least one active region. The channel layer is disposed on the at least one active region. The barrier layer is disposed on the channel layer. The gate structure is disposed on the barrier layer. The gate structure includes: a metal layer and a P-type group III-V semiconductor layer. The P-type group III-V semiconductor layer is vertically disposed between the metal layer and the barrier layer. The P-type group III-V semiconductor layer includes a lower portion and an upper portion located on the lower portion, and the upper portion has a top area greater than a top area of the lower portion.

The present invention provides a method of forming an HEMT device including: forming a channel layer on a substrate; forming a barrier layer on the channel layer; forming a passivation layer on the barrier layer; patterning the passivation layer to form an opening; forming a P-type group III-V semiconductor layer in the opening; and forming a metal layer on the P-type group III-V semiconductor layer.

The present invention provides a HEMT device including: a substrate, a channel layer, a barrier layer, and a gate structure. The substrate has at least one active region. The channel layer is disposed on the at least one active region. The barrier layer is disposed on the channel layer. The gate structure is disposed on the barrier layer. The gate structure extends along a first direction and across the at least one active region in a top view. The gate structure includes a metal layer and a P-type group III-V semiconductor layer vertically disposed between the metal layer and the barrier layer. The P-type group III-V semiconductor layer includes: a lower portion and an upper portion on the lower portion, and the upper portion has a top area greater than a top area of the lower portion. In the top view, the upper portion protrudes from a first sidewall of the lower portion along a second direction perpendicular to the first direction by a first distance, and the upper portion protrudes from a second sidewall of the lower portion along the second direction by a second distance.

In light of the above, the present invention increases the Schottky diode current by enlarging the contact area between the metal layer and the P-type group III-V semiconductor layer in the gate structure, so that a large number of the electron holes (or positive charges) in the P-type group III-V semiconductor layer is injected into the two-dimensional hole gas layer, thereby increasing the two-dimensional electron gas density of the HEMT device. In this case, the present invention can improve the control of the two-dimensional hole gas layer, thereby improving the gate control capability of the HEMT device, and also reducing the drain-induced barrier lowering (DIBL) and the subthreshold swing (SS).

To provide a further understanding of the aforementioned and other features and advantages of the disclosure, exemplary embodiments, together with the reference drawings, are described in detail below.

DESCRIPTION OF THE EMBODIMENTS

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1A:
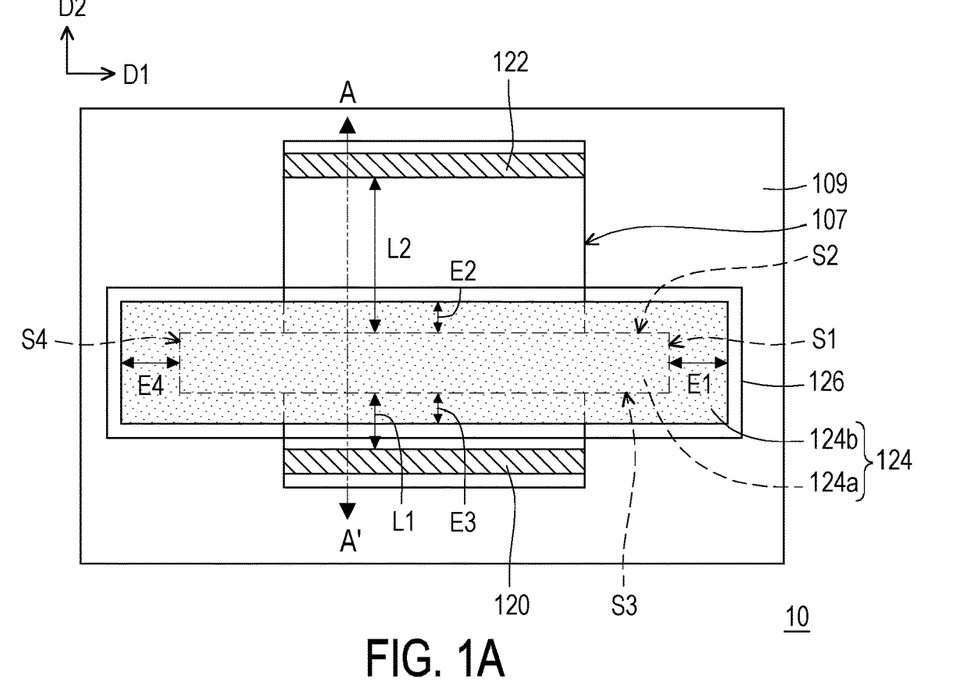
FIG. 1A is a schematic top view of a HEMT device according to an embodiment of the present invention.
Figure 1B:
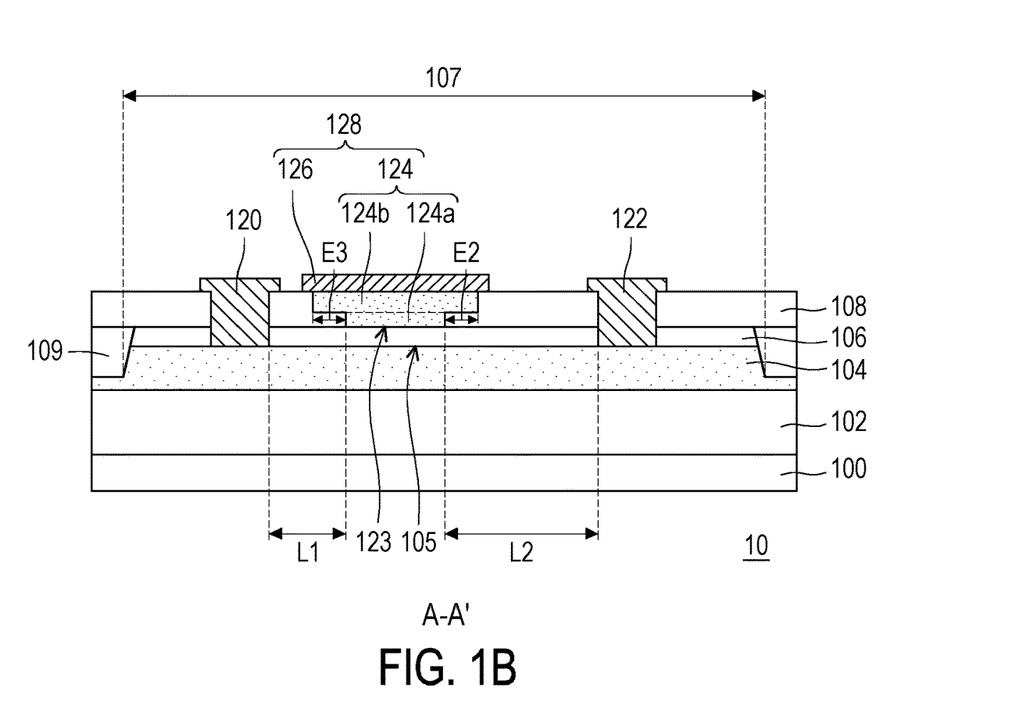
FIG. 1B is a schematic cross-sectional view taken along line A-A' of FIG. 1A.

FIG. 1A is a schematic top view of a HEMT device according to an embodiment of the present invention. FIG. 1B is a schematic cross-sectional view taken along line A-A' of FIG. 1A.

Referring to FIG. 1A and FIG. 1B, an embodiment of the present invention provides a HEMT device 10 including: a substrate 100, a buffer layer 102, a channel layer 104, a barrier layer 106, a passivation layer 108, an isolation structure 109, a source electrode 120, a drain electrode 122, and a gate structure 128.

Specifically, the substrate 100 has at least one active region 107. The isolation structure 109 may be disposed on the substrate 100 and the buffer layer 102, and embedded in the channel layer 104 and the barrier layer 106, so as to define the active region 107. In some embodiments, the isolation structure 109 may surround the channel layer 104 and the barrier layer 106 on the active region 107. As shown in FIG. 1B, the gate structure 128 may include a P-type gate 124 and a metal layer 126 on the P-type gate 124. The metal layer 126 may be in direct contact with the P-type gate 124 to form a Schottky diode. The barrier layer 106 may be in direct contact with the channel layer 104 and the P-type gate 124 to form a PIN diode. That is to say, in the present embodiment, the HEMT device 10 is constituted by the Schottky diode and the PIN diode connected in series in a back-to-back configuration.

As shown in FIG. 1A, the P-type gate 124 (or the gate structure 128) may extend along a first direction D1 and across the active region 107. As shown in FIG. 1B, the P-type gate 124 may include a lower portion 124a and an upper portion 124b on the lower portion 124a. In the present embodiment, a top area of the upper portion 124b may be greater than a top area of the lower portion 124a. That is, a sidewall of the upper portion 124b may protrude outward from a sidewall of the lower portion 124a by a non-zero distance to enlarge the top area of the upper portion 124b. In detail, as shown in FIG. 1A, the lower portion 124a may include a first sidewall S1, a second sidewall S2, a third sidewall S3, and a fourth sidewall S4. The first sidewall S1 and the fourth sidewall S4 may be opposed to each other, while the second sidewall S2 and the third sidewall S3 may be opposed to each other. In some embodiments, as shown in FIG. 1A, the upper portion 124b protrudes from the first sidewall S1 of the lower portion 124a by a first distance E1 and from the fourth sidewall S4 of the lower portion 124a by a fourth distance E4 along the first direction D1. In addition, the upper portion 124b also protrudes from the second sidewall S2 of the lower portion 124a by a second distance E2 and from the third sidewall S3 of the lower portion 124a by a third distance E3 along the second direction D2 perpendicular to the first direction D1. It should be noted that the extended upper portion 124b of the P-type gate 124 can increase the contact area between the metal layer 126 and the P-type gate 124, i.e., the contact area between the metal layer and the semiconductor layer, thereby increasing the Schottky diode current. In such embodiment, when the gate voltage is applied so that the Schottky diode starts to conduct, a two-dimensional electron gas (2DEG) layer 105 is formed at the heterojunction between the barrier layer 106 and the channel layer 104, and a large number of the electron holes (or positive charges) in the P-type gate 124 will be injected into the two-dimensional hole gas layer 123. In order to maintain the electrical neutrality among the P-type gate 124, the barrier layer 106, the channel layer 104, and the buffer layer 102, the number of electrons in the channel layer 104 will increase accordingly, so that the two-dimensional electron gas density increases. Therefore, the number of two-dimensional electron gas (2DEG) may be controlled by adjusting the amount of two-dimensional hole gas (2DHG), thereby affecting the current. In the present embodiment, the control of the two-dimensional hole gas layer (2DHG) can be improved, thereby improving the gate control capability of the HEMT device 10, and also reducing the drain-induced barrier lowering (DIBL) and the subthreshold swing (SS).

On the other hand, the source electrode 120 may be disposed on the substrate 100 at one side of the third sidewall S3 of the gate structure 128, and the drain electrode 122 may be disposed on the substrate 100 at one side of the second sidewall S2 of the gate structure 128. In some embodiments, a length L1 between the source electrode 120 and the third sidewall S3 of the gate structure 128 may be less than a length L2 between the drain electrode 122 and the second sidewall S2 of the gate structure 128. The length L1 is, for example, 3 μm, and the length L2 is, for example, 15 μm. In the present embodiment, the third distance E3 may be less than length L1, and the second distance E2 may be less than length L2.

Although FIG. 1A illustrates that the upper portion 124b of the P-type gate 124 extends outward from the four sidewalls S1, S2, S3 and S4 of the lower portion 124a respectively, the present invention is not limited thereto. Various embodiments of the HEMT device will be described in detail below in conjunction with FIG. 2A to FIG. 2E.

Figure 2A:
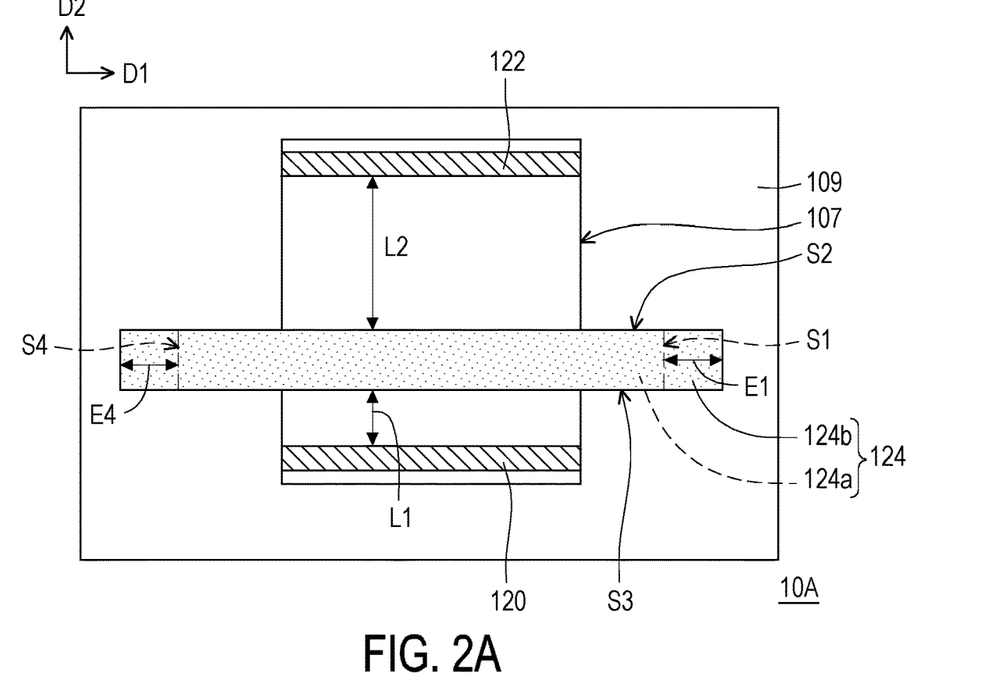
FIG. 2A to FIG. 2E are schematic top views of a HEMT device according to various embodiments of the present invention.

In some embodiments, as shown in FIG. 2A, the upper portion 124b of the HEMT device 10A extends outward along the first direction D1 from the opposite first and fourth sidewalls S1 and S4 of the lower portion 124a, but not from the second and third sidewalls S2 and S3. In such embodiment, the first distance E1 extending outward from the first sidewall S1 may be substantially equal to the fourth distance E4 extending outward from the fourth sidewall S4. The first distance E1 may be greater than 0 μm and less than or equal to 10 μm. In another embodiment, the first distance E1 may not be equal to the fourth distance E4.

Figure 2B:
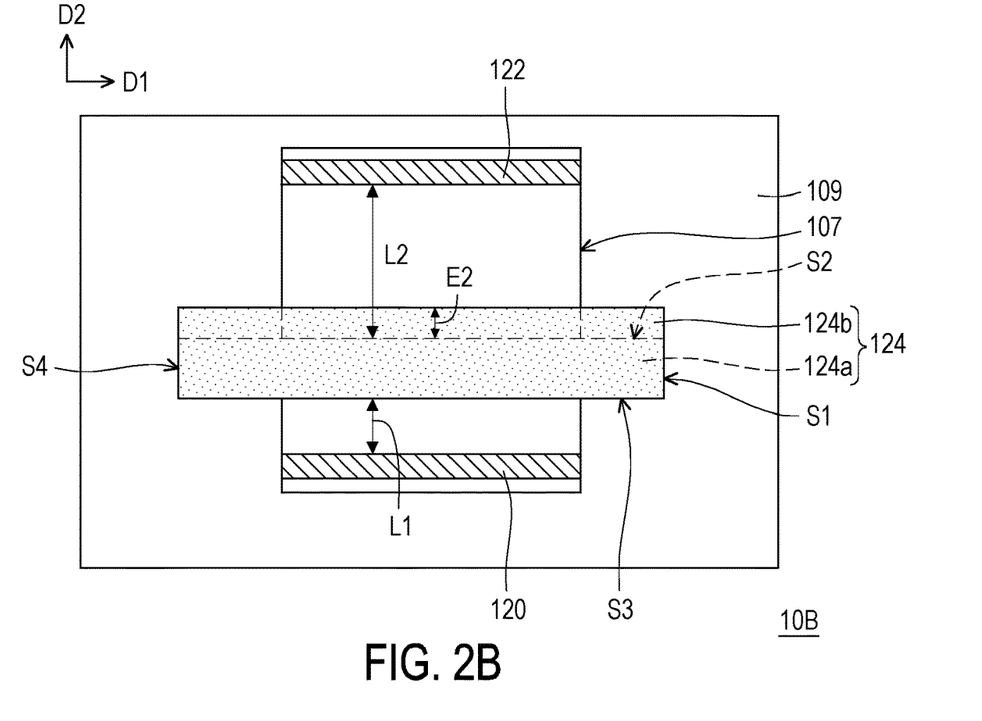

In alternative embodiments, as shown in FIG. 2B, the upper portion 124b of the HEMT device 10B extends outward along the second direction D2 from the second sidewall S2 of the lower portion 124a, but not from the first sidewall S1, the third sidewall S3, and the fourth sidewall S4. In such embodiment, the second distance E2 extending outward from the second sidewall S2 may be greater than 0 μm and less than or equal to 14 μm.

Figure 2C:
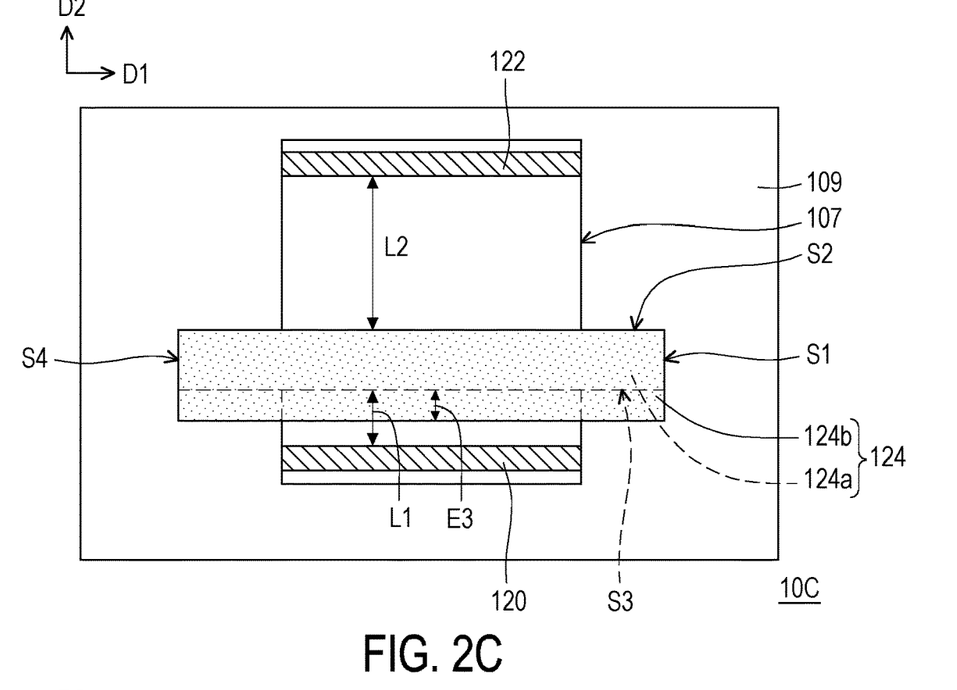

In other embodiments, as shown in FIG. 2C, the upper portion 124b of the HEMT device 10C extends outward along the second direction D2 from the third sidewall S3 of the lower portion 124a, but not from the first sidewall S1, the second sidewall S2, and the fourth sidewall S4. In such embodiment, the third distance E3 extending outward from the third sidewall S3 may be greater than 0 μm and less than or equal to 2 μm.

Figure 2D:
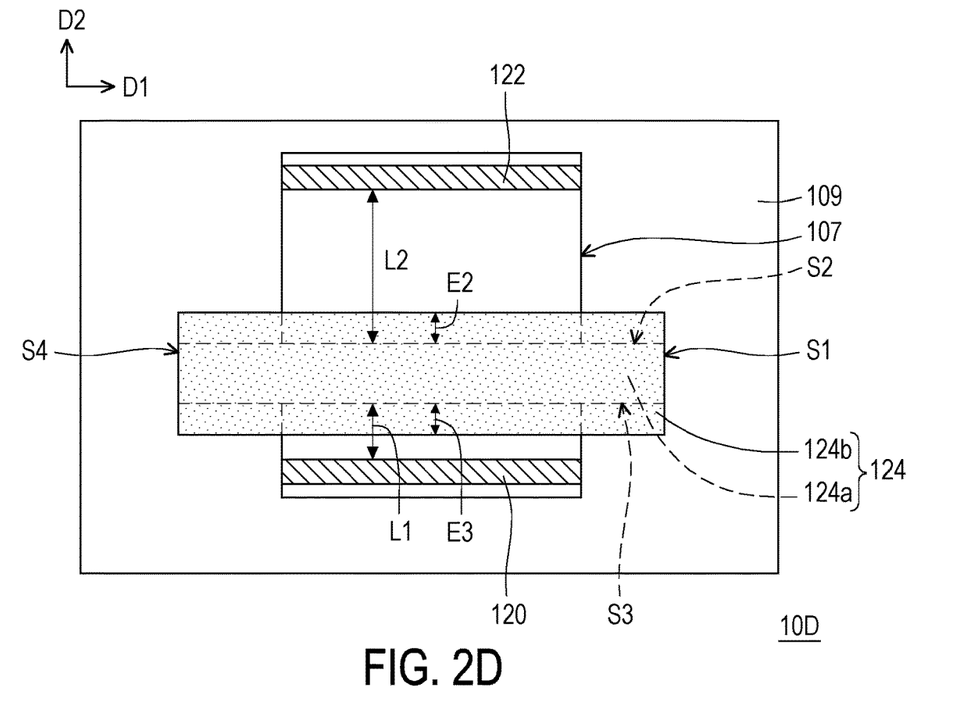

In yet another embodiment, as shown in FIG. 2D, the upper portion 124b of the HEMT device 10D extends outward along the second direction D2 from the opposite second and third sidewalls S2 and S3 of the lower portion 124a, but not from the first sidewall S1 and the fourth sidewall S4. In such embodiment, the second distance E2 extending outward from the second sidewall S2 may be greater than 0 μm and less than or equal to 14 μm, and the third distance E3 extending outward from the third sidewall S3 may be greater than 0 μm and less than or equal to 2 μm.

Figure 2E:
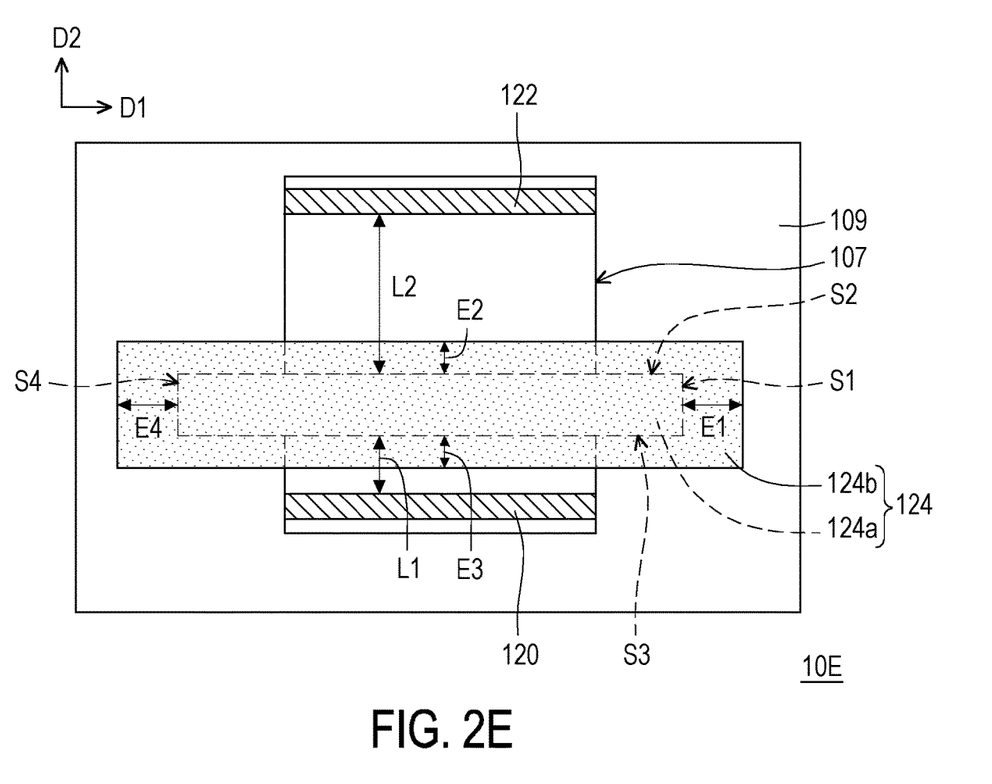

In another embodiment, as shown in FIG. 2E, the upper portion 124b of the HEMT device 10E extends outward from the four sidewalls S1, S2, S3, S4 of the lower portion 124a, respectively. In such embodiment, the contact area between the P-type gate 124 and the metal layer 126 may be maximized to maximum increase the Schottky diode current, thereby improving the two-dimensional electron gas and the gate control capability of the HEMT device 10E.

FIG. 3A to FIG. 3E are schematic cross-sectional views illustrating a manufacturing process of a HEMT device according to a first embodiment of the present invention. In order to enable those skilled in the art to implement the present invention, the following further specifically describes the manufacturing process of the HEMT device 10 of the first embodiment.

Figure 3A:
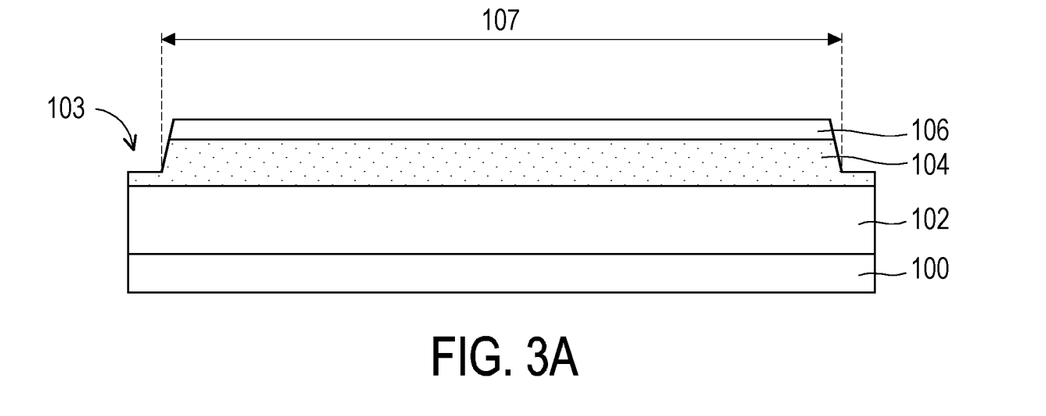
FIG. 3A to FIG. 3E are schematic cross-sectional views illustrating a manufacturing process of a HEMT device according to a first embodiment of the present invention.

First, referring to FIG. 3A, a substrate 100 is provided. In some embodiments, the material of the substrate 100 may be, but is not limited to, a silicon substrate, a silicon carbide (SiC) substrate, a sapphire substrate, a silicon on insulator (SOI) substrate, or an on-insulator substrate, or a germanium on insulator (GOI) substrate.

Next, a buffer layer 102, a channel layer 104 and a barrier layer 106 are sequentially formed on the substrate 100. In one embodiment, the buffer layer 102, the channel layer 104 and the barrier layer 106 may be formed by molecular beam epitaxy (MBE), metal-organic chemical vapor deposition (MOCVD), hydride vapor phase epitaxy (HYPE), atomic layer deposition (ALD) or other suitable method.

In detail, the buffer layer 102 may be disposed between the substrate 100 and the channel layer 104 to reduce stress or lattice mismatch between the substrate 100 and the channel layer 104. In one embodiment, the material of the buffer layer 102 includes a group III-V compound semiconductor material, and may have a single-layered or multi-layered structure. For example, the material of the buffer layer 102 includes AlN, GaN, AlGaN, InGaN, AlInN, AlGaInN or a combination thereof.

The channel layer 104 may be disposed between the buffer layer 102 and the barrier layer 106. Since there is a discontinuous energy gap between the channel layer 104 and the barrier layer 106, the electrons will be accumulated at the heterojunction between the channel layer 104 and the barrier layer 106 due to the polarization effect, thereby resulting in a thin layer with high electron mobility, i.e., the two-dimensional electron gas (2DEG) layer. In one embodiment, the material of the channel layer 104 includes a group III-V compound semiconductor material, which may be, for example, undoped or unintentionally doped GaN. However, the present invention is not limited thereto. In other embodiments, as long as the energy gap of the material of the channel layer 104 is different from the energy gap of the material of the barrier layer 106, the material of the channel layer 104 is within the scope of the present invention. In one embodiment, the material of the barrier layer 106 includes a group III-V compound semiconductor material, and may have a single-layered or multi-layered structure. In one embodiment, the barrier layer 106 includes AlGaN, AlInN, AlN, AlGaInN, or a combination thereof. In one embodiment, barrier layer 106 may be a doped or undoped layer. In the present embodiment, the channel layer 104 and the barrier layer 106 have different composition materials. For example, the channel layer 104 is a GaN layer, and the barrier layer 106 is an AlGaN layer.

After the buffer layer 102, the channel layer 104 and the barrier layer 106 are sequentially formed on the substrate 100, one or more lithography processes and etching processes may be performed to remove a portion of the barrier layer 106 and a portion of the channel layer 104, thereby forming a mesa region 107 on the substrate 100. As shown in FIG. 3A, the mesa region 107 may be a protruding structure surrounded by a trench 103. In the subsequent process, an isolation structure (e.g., a shallow trench isolation (STI) structure or an isolation doped region) may be formed in the trench 103 to avoid unnecessary electrical connection between the mesa region 107 and other semiconductor components in the periphery. In the present embodiment, the mesa region 107 may also be referred to as an active region.

Figure 3B:
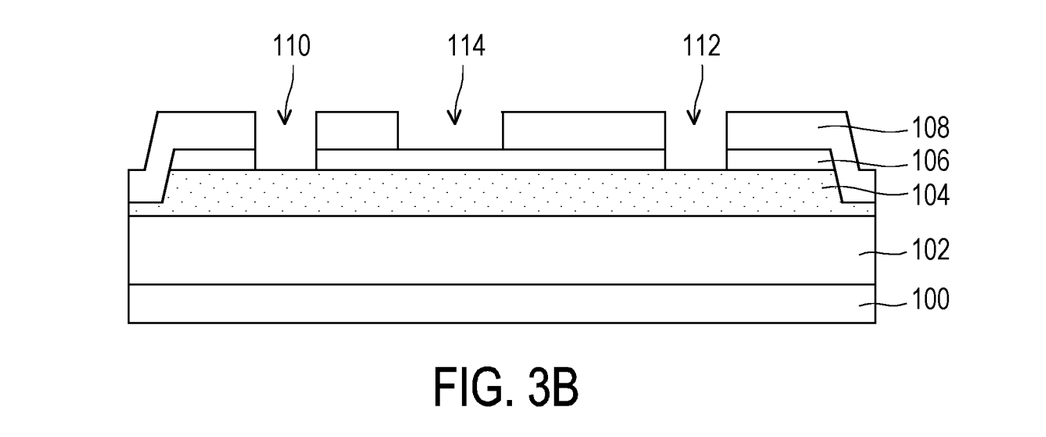

Referring to FIG. 3B, a passivation layer 108 is formed on the barrier layer 106. In one embodiment, the passivation layer 108 may be a dielectric material with a critical electric field of about 10 MV/cm, such as silicon oxide, silicon nitride, or the like. The passivation layer 108 may be formed by MBE, MOCVD, HVPE, ALD, or other suitable methods.

Next, the passivation layer 108 and the barrier layer 106 are patterned to form a plurality of openings 110, 112, and 114. Specifically, the opening 114 may penetrate through the passivation layer 108 to expose the surface of the barrier layer 106. The openings 110 and 112 are respectively disposed on opposite sides of the opening 114, and penetrate through the passivation layer 108 and the barrier layer 106 to expose the surface of the channel layer 104, respectively. In the present embodiment, the opening 110 may be regarded as an opening for the source region, the opening 112 may be regarded as an opening for the drain region, and the opening 114 may be regarded as an opening for the gate region.

Figure 3C:
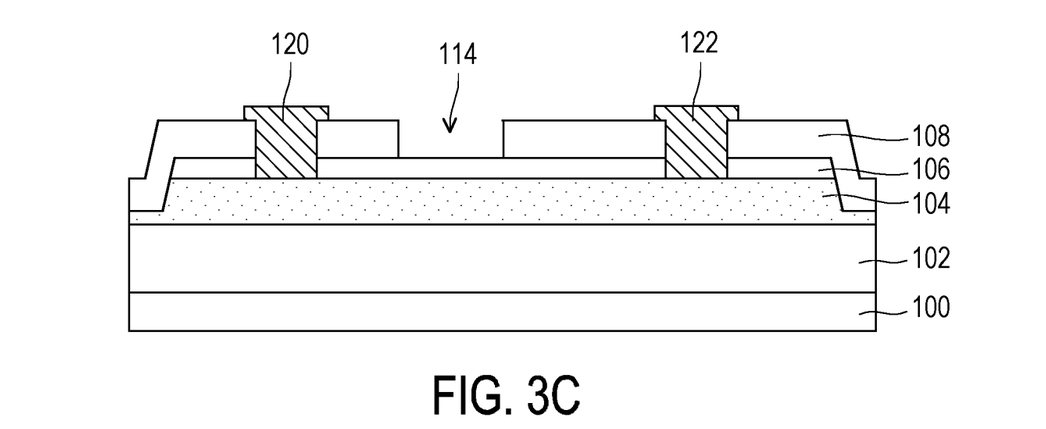

Referring to FIG. 3C, a conductive material is formed to fill into the opening 110 and the opening 112 by an electroplating method or an evaporation method, so as to form a source electrode 120 in the opening 110 and form a drain electrode 122 in the opening 112. In such embodiment, the source electrode 120 and the drain electrode 122 may be formed in the same step, and may collectively be referred to as source/drain electrodes that penetrate through the passivation layer 108 and the barrier layer 106 to contact the channel layer 104. In one embodiment, the said conductive material may include a metal (e.g., Ta, Ti, W, Pd, Ni, Au, Al, or a combination thereof), a metal nitride (e.g., TaN, TiN, WN, or a combination thereof), a metal silicide (e.g., $WSi_x$), or a combination thereof. It should be noted that, when forming the source electrode 120 and the drain electrode 122, the opening 114 may be protected by a mask layer (e.g., a photoresist layer) to prevent the conductive material from filling into the opening 114. In addition, after forming the source electrode 120 and the drain electrode 122, an annealing treatment may be performed to diffuse the metal (e.g., aluminum) of the source electrode 120 and the drain electrode 122 into the semiconductor layer (e.g., the channel layer 104 or the like), so as to form an ohmic contact. In one embodiment, the annealing treatment includes a rapid thermal annealing treatment (RTA) or a furnace annealing treatment. Taking the rapid thermal annealing treatment as an example, the treatment temperature of the rapid thermal annealing treatment may be, for example, 400° C. to 600° C.; and the treatment time thereof may be, for example, 30 minutes to 60 minutes.

Figure 3D:
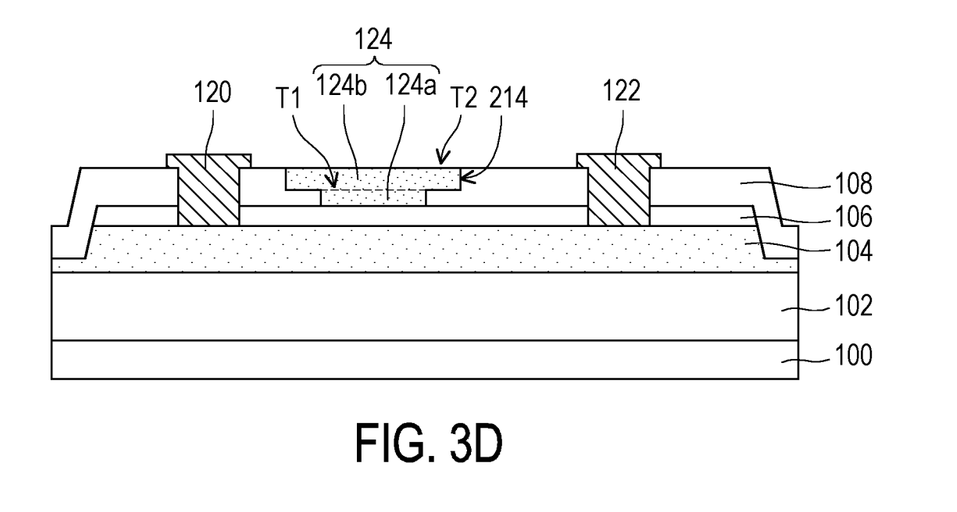

Referring to FIG. 3C and FIG. 3D, after removing the said mask layer (e.g., the photoresist layer), a portion of the passivation layer 108 around the opening 114 may be removed to form a T-shaped opening 214. Specifically, the T-shaped opening 214 has a wider upper opening and a narrower lower opening in a cross-sectional view, as shown in FIG. 3D. In some embodiments, the T-shaped opening 214 may be referred to as a dual damascene opening. Next, a P-type group III-V semiconductor layer 124 is formed in the opening 214. In some embodiments, the P-type group III-V semiconductor layer 124 may include a group III-V semiconductor material doped with dopants such as C, Fe, Mg, Zn, or the like, for example GaN, AlGaN, InGaN, or InAlGaN. The P-type group III-V semiconductor layer 124 may be formed by MBE, MOCVD, HYPE, ALD, or other suitable methods. In the present embodiment, the P-type group III-V semiconductor layer 124 and the barrier layer 106 have different compositions. For example, the P-type group III-V semiconductor layer 124 is a P-type GaN layer, and the barrier layer 106 is an AlGaN layer. In addition, the P-type group III-V semiconductor layer 124 may also be referred to as a P-type gate.

In the present embodiment, the P-type group III-V semiconductor layer 124 may include a lower portion 124a and an upper portion 124b on the lower portion 124a. A top area T2 of the upper portion 124b may be greater than a top area T1 of the lower portion 124a. Therefore, as shown in FIG. 3D, the P-type group III-V semiconductor layer 124 has a T-shaped profile in a cross-sectional plane, which has a wider upper portion 124b and a narrower lower portion 124a. From another perspective, the P-type group III-V semiconductor layer 124 is embedded in the passivation layer 108, and the passivation layer 108 laterally encapsulates the P-type group III-V semiconductor layer 124.

Figure 3E:
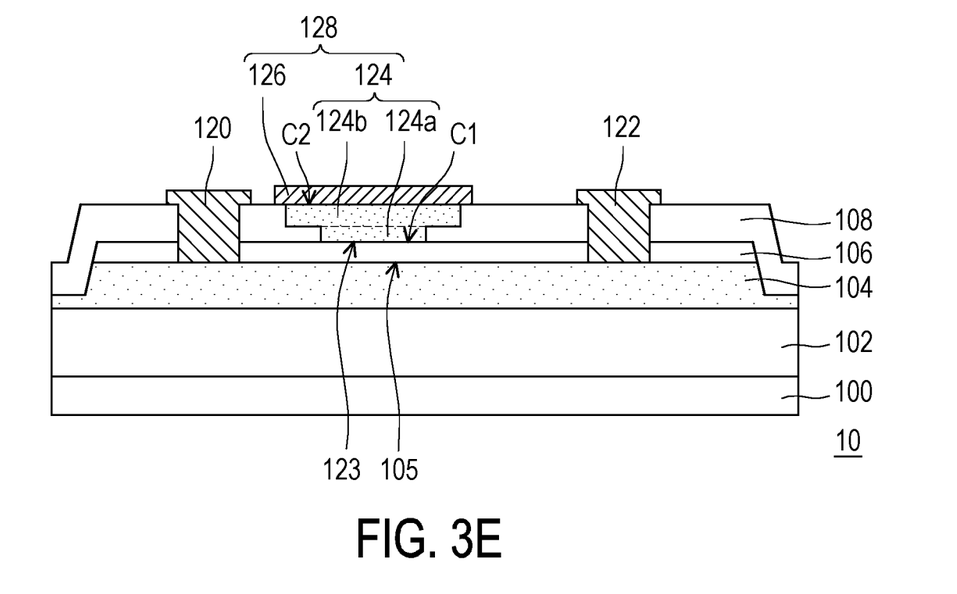

Referring to FIG. 3E, a metal layer 126 is formed on the P-type group III-V semiconductor layer 124 to form a gate structure 128, thereby accomplishing the HEMT device 10. In some embodiments, a material of the metal layer 126 may include a metal (e.g., Ta, Ti, W, Pd, Ni, Au, Al, or a combination thereof), a metal nitride (e.g., TaN, TiN, WN, or a combination thereof), a metal silicide (e.g., $WSi_x$), or a combination thereof. In one embodiment, the metal layer 126 in the gate structure 128 and the source electrode 120 and the drain electrode 122 may have different conductive materials, so that the metal layer 126 may be in direct contact with the P-type group III-V semiconductor layer 124 to form a Schottky contact or a Schottky diode, while the source electrode 120 and the drain electrode 122 are in direct contact with the channel layer 104 to form the ohmic contacts. In addition, an area of the metal layer 126 may be greater than a top area of the P-type group III-V semiconductor layer 124 to maximize a contact area C2 between the metal layer 126 and the P-type group III-V semiconductor layer 124.

It should be noted that the contact area C2 between the metal layer 126 and the upper portion 124b may be greater than a contact area C1 between the lower portion 124a and the barrier layer 106. In such embodiment, when the gate voltage is applied so that the Schottky diode starts to conduct, a two-dimensional electron gas (2DEG) layer 105 is formed at the heterojunction between the barrier layer 106 and the channel layer 104, and a large number of the electron holes (or positive charges) in the P-type gate 124 will be injected into the two-dimensional hole gas layer 123. In order to maintain the electrical neutrality among the P-type gate 124, the barrier layer 106, the channel layer 104, and the buffer layer 102, the number of electrons in the channel layer 104 will increase accordingly, so that the two-dimensional electron gas density increases. Therefore, the number of two-dimensional electron gas (2DEG) may be controlled by adjusting the amount of two-dimensional hole gas (2DHG), thereby affecting the current. In the present embodiment, the control of the two-dimensional hole gas layer (2DHG) can be improved, thereby improving the gate control capability of the HEMT device 10, and also reducing the drain-induced barrier lowering (DIBL) and the subthreshold swing (SS). In this case, the present invention can effectively improve the gate control capability of the HEMT device 10.

FIG. 4A to FIG. 4E are schematic cross-sectional views illustrating a manufacturing process of a HEMT device according to a second embodiment of the present invention. In order to enable those skilled in the art to implement the present invention, the following further specifically describes the manufacturing process of a HEMT device 20 of the second embodiment.

Figure 4A:
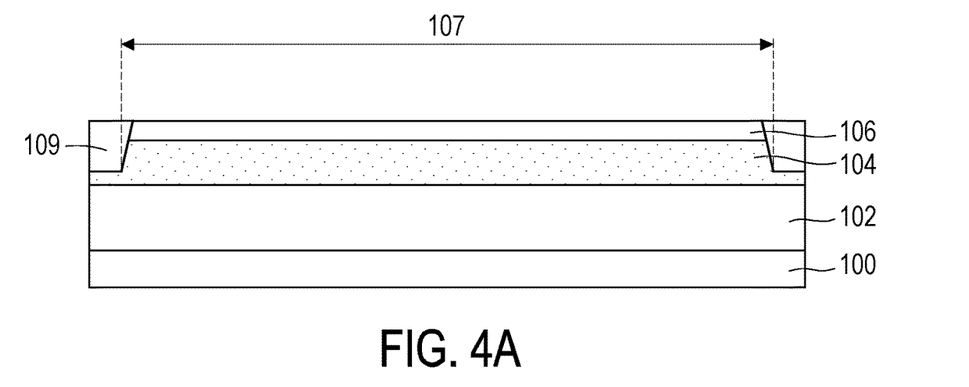
FIG. 4A to FIG. 4E are schematic cross-sectional views illustrating a manufacturing process of a HEMT device according to a second embodiment of the present invention.

Referring to FIG. 4A, after the buffer layer 102, the channel layer 104, and the barrier layer 106 are sequentially formed on the substrate 100, an isolation structure 109 is formed to surround the mesa region 107. In some embodiments, the isolation structure 109 is formed by performing an ion implantation process on the periphery of the mesa region 107 to avoid unnecessary electrical connection between the mesa region 107 and other semiconductor components in the periphery. In alternative embodiments, the isolation structure 109 is formed by removing a portion of the barrier layer 106 and a portion of the channel layer 104 to form a trench surrounding the mesa region 107 (e.g., the trench 103 in FIG. 3A), and then filling in the trench with an isolation material.

Figure 4B:
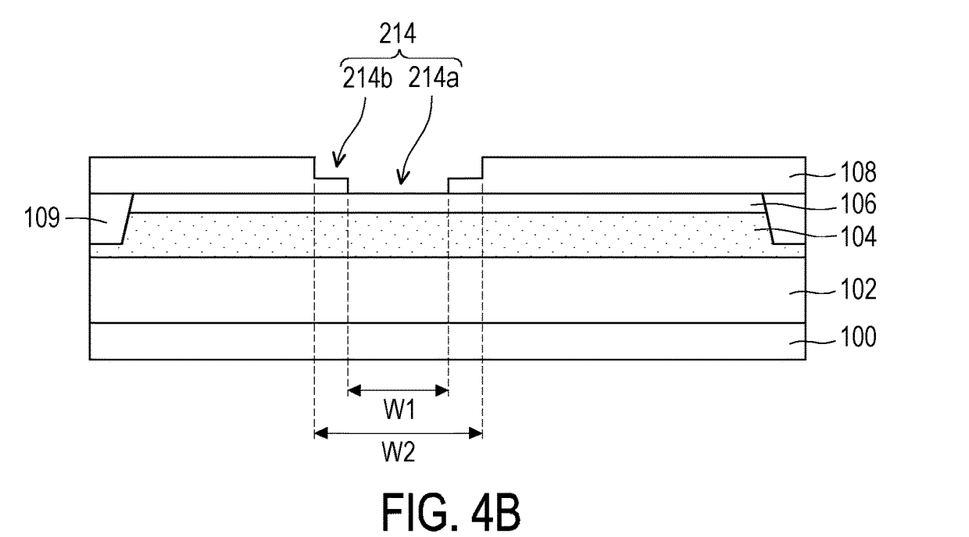

Referring to FIG. 4B, a passivation layer 108 is formed on the barrier layer 106. Afterwards, the passivation layer 108 is patterned to form an opening 214. In some embodiments, the opening 214 may be formed by a dual damascene process, thus the opening 214 may also be referred to as the dual damascene opening. In detail, the opening 214 may include a lower opening 214a and an upper opening 214b on the lower opening 214a, and a width W2 of the upper opening 214b is greater than a width W1 of the lower opening 214a. In this case, the opening 214 may be referred to as a T-shaped opening in the cross-sectional plane.

Figure 4C:
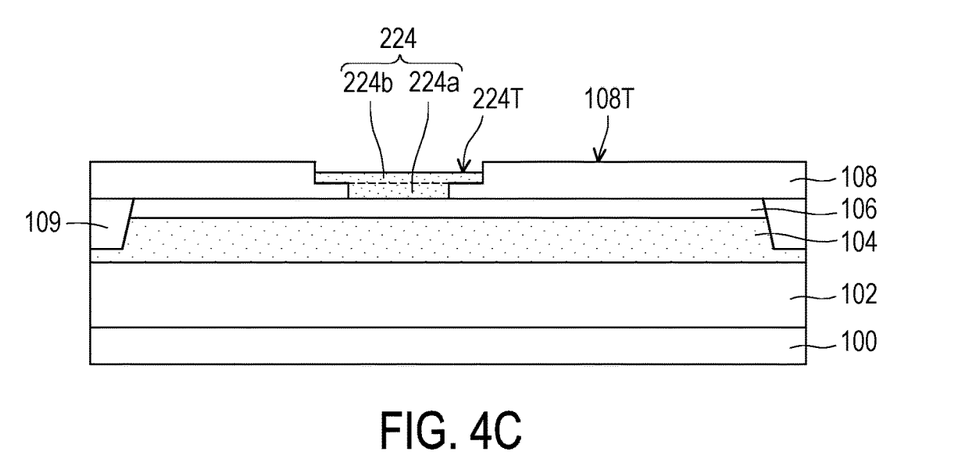

Referring to FIG. 4B and FIG. 4C, a P-type group III-V semiconductor layer 224 is formed in the opening 214. The P-type group III-V semiconductor layer 224 may include a lower portion 224a formed in the lower opening 214a and an upper portion 224b formed in the upper opening 214b. A top area of the upper portion 224b may be greater than a top area of the lower portion 224a. The material and the forming method of the P-type group III-V semiconductor layer 224 are the same as those of the P-type group III-V semiconductor layer 124, which have been described in the above paragraph of FIG. 3D, and will not be repeated here. In some embodiments, a top surface 224T of the upper portion 224b may be lower than or substantially level with a top surface 108T of the passivation layer 108.

Figure 4D:
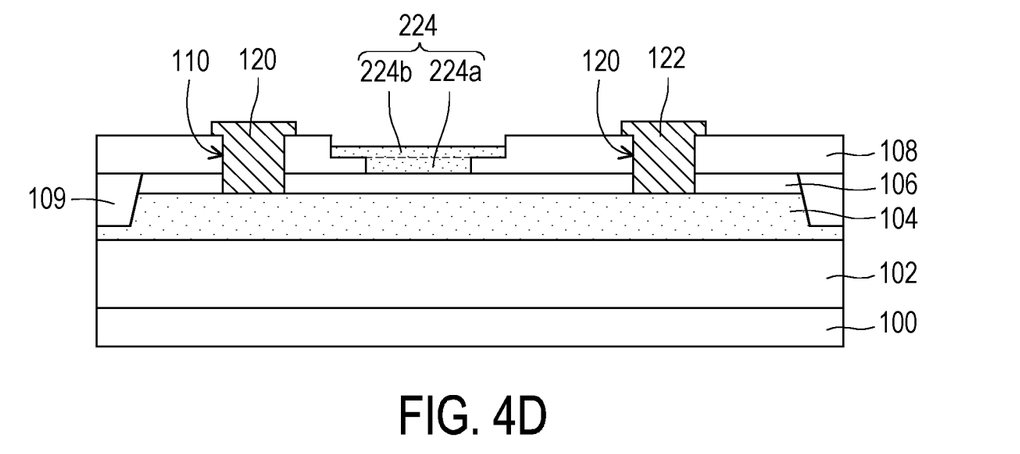

Referring to FIG. 4D, the passivation layer 108 and the barrier layer 106 is patterned to form the openings 110 and 112 on both sides of the P-type group III-V semiconductor layer 224, respectively. Specifically, the openings 110 and 112 may penetrate through the passivation layer 108 and the barrier layer 106 to expose the surface of the channel layer 104, respectively. Afterwards, a conductive material is formed to fill into the opening 110 and the opening 112 by an electroplating method or an evaporation method, so as to form the source electrode 120 in the opening 110 and form the drain electrode 122 in the opening 112. In addition, after forming the source electrode 120 and the drain electrode 122, an annealing treatment may be performed to diffuse the metal (e.g., aluminum) of the source electrode 120 and the drain electrode 122 into the semiconductor layer (e.g., the channel layer 104 or the like), so as to form an ohmic contact.

Figure 4E:
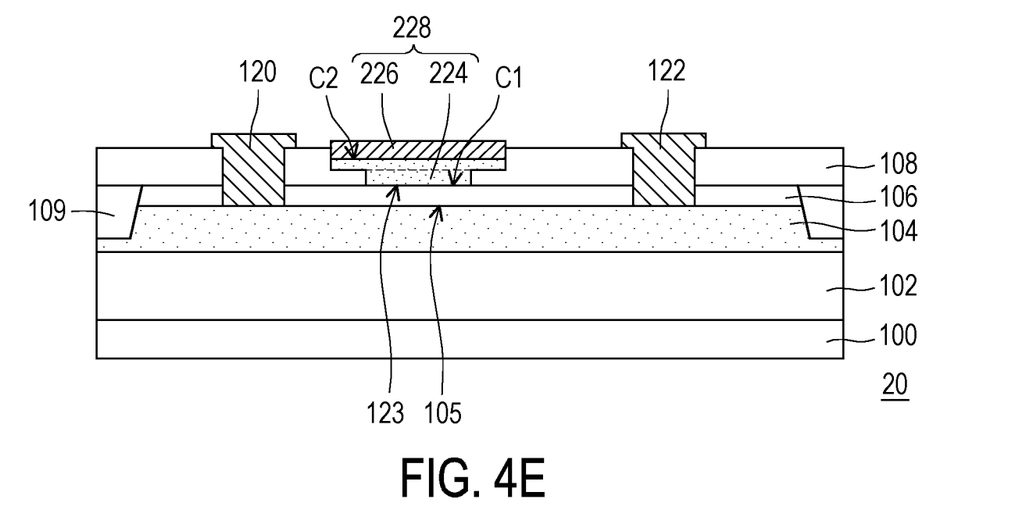

Referring to FIG. 4E, after forming the said ohmic contact, a metal layer 226 is formed on the P-type group III-V semiconductor layer 224 to form a gate structure 228, thereby accomplishing the HEMT device 20. In some embodiments, a portion of the metal layer 226 may be embedded in the opening 214 so that the sidewall of the metal layer 226 is flush with the sidewall of the upper portion 224b. In other embodiments, a portion of the metal layer 226 may extend from the opening 214 to cover a portion of the top surface of the passivation layer 108. It should be noted that the contact area C2 between the metal layer 226 and the P-type group III-V semiconductor layer 224 may be greater than the contact area C1 between the P-type group III-V semiconductor layer 224 and the barrier layer 106. In this case, a large number of the electron holes (or positive charges) in the P-type group III-V semiconductor layer 224 will be injected into the two-dimensional hole gas layer 123 to increase the two-dimensional electron gas density, thereby improving device performance. In addition, under the same threshold voltage (Vt), the leakage current of the HEMT device 20 may be less than that of the conventional HEMT device by about 5 orders of magnitude. That is to say, the present invention can effectively reduce the leakage current of the HEMT device, thereby improving the gate control capability.

In summary, the present invention increases the Schottky diode current by enlarging the contact area between the metal layer and the P-type group III-V semiconductor layer in the gate structure, so that a large number of the electron holes (or positive charges) in the P-type group III-V semiconductor layer is injected into the two-dimensional hole gas layer, thereby increasing the two-dimensional electron gas density of the HEMT device. In this case, the present invention can improve the control of the two-dimensional hole gas layer, thereby improving the gate control capability of the HEMT device, and also reducing the drain-induced barrier lowering and the subthreshold swing.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A high electron mobility transistor (HEMT) device, comprising:
    a substrate having at least one active region;
    a channel layer disposed on the at least one active region;
    a barrier layer disposed on the channel layer; and
    a gate structure disposed on the barrier layer and extended along a first direction in a top view, wherein the gate structure comprises:
    a metal layer; and
    a P-type group III-V semiconductor layer vertically disposed between the metal layer and the barrier layer, wherein the P-type group III-V semiconductor layer comprises a lower portion and an upper portion on the lower portion, and the upper portion has a top area greater than a top area of the lower portion, wherein an area of the metal layer is greater than a top area of the P-type group III-V semiconductor layer.

2. The HEMT device of claim 1, wherein a contact area between the metal layer and the upper portion is greater than a contact area between the lower portion and the barrier layer.

3. The HEMT device of claim 1, wherein in the top view, the gate structure extends along a first direction and across the at least one active region, and the upper portion protrudes from a first sidewall of the lower portion along the first direction by a first distance, wherein the first distance is greater than 0 μm, and less than and equal to 10 μm.

4. The HEMT device of claim 1, wherein in the top view, the upper portion protrudes from a second sidewall of the lower portion along a second direction perpendicular to the first direction by a second distance, wherein the second distance is greater than 0 μm, and less than and equal to 14 μm.

5. The HEMT device of claim 1, wherein in the top view, the upper portion protrudes from a third sidewall of the lower portion along a second direction perpendicular to the first direction by a third distance, wherein the third distance is greater than 0 μm, and less than and equal to 2 μm.

6. The HEMT device of claim 1, further comprising: a passivation disposed on the barrier layer and laterally encapsulating the P-type group III-V semiconductor layer.

7. The HEMT device of claim 6, further comprising: source/drain (S/D) electrodes disposed at opposite sides of the gate structure, wherein the S/D electrodes penetrate through the passivation layer and the barrier layer to contact the channel layer.

8. The HEMT device of claim 1, further comprising: an isolation structure surrounding the channel layer and the barrier layer on the at least one active region.

9. The HEMT device of claim 1, further comprising: a buffer layer vertically disposed between the substrate and the channel layer.

10. A high electron mobility transistor (HEMT) device, comprising:
    a substrate having at least one active region;
    a channel layer disposed on the at least one active region;
    a barrier layer disposed on the channel layer; and
    a gate structure disposed on the barrier layer, wherein the gate structure extends along a first direction and across the at least one active region in a top view, and the gate structure comprises:
    a metal layer; and
    a P-type group III-V semiconductor layer vertically disposed between the metal layer and the barrier layer, wherein the P-type group III-V semiconductor layer comprises a lower portion and an upper portion on the lower portion, and the upper portion has a top area greater than a top area of the lower portion,
    wherein in the top view, the upper portion protrudes from a first sidewall of the lower portion along a second direction perpendicular to the first direction by a first distance, and the upper portion protrudes from a second sidewall of the lower portion along the second direction by a second distance, and
    wherein the first distance is greater than 0 μm, and less than and equal to 14 μm, while the second distance is greater than 0 μm, and less than and equal to 2 μm.

* * * * *